United States Patent
Tomonaga et al.

(10) Patent No.: US 9,412,685 B2
(45) Date of Patent: Aug. 9, 2016

(54) SEMICONDUCTOR DEVICE AND METHOD OF MANUFACTURING THE SAME

(71) Applicant: J-DEVICES CORPORATION, Usuki (JP)

(72) Inventors: Yoshiyuki Tomonaga, Kawasaki (JP); Mitsuru Ooida, Kawasaki (JP); Katsumi Watanabe, Kawasaki (JP); Hidenari Sato, Kawasaki (JP)

(73) Assignee: J-DEVICES CORPORATION, Usuki (JP)

( * ) Notice: Subject to any disclaimer, the term of this patent is extended or adjusted under 35 U.S.C. 154(b) by 0 days.

(21) Appl. No.: 14/099,288

(22) Filed: Dec. 6, 2013

(65) Prior Publication Data

US 2014/0159215 A1 Jun. 12, 2014

(30) Foreign Application Priority Data

Dec. 7, 2012 (JP) .................................. 2012-267892

(51) Int. Cl.
*H01L 21/44* (2006.01)
*H01L 23/495* (2006.01)
(Continued)

(52) U.S. Cl.
CPC .......... *H01L 23/49568* (2013.01); *H01L 21/56* (2013.01); *H01L 21/565* (2013.01); *H01L 23/3128* (2013.01); *H01L 23/3135* (2013.01);
(Continued)

(58) Field of Classification Search
CPC .......... H01L 2924/01079; H01L 2924/01078; H01L 2924/01029; H01L 23/4334; H01L 2224/48247; H01L 2224/48091; H01L 21/565
USPC ......... 257/706, 707, 710, 712, 796, 788, 789, 257/787, 774, 676, 778, 777, 686, 692, 758
See application file for complete search history.

(56) References Cited

U.S. PATENT DOCUMENTS 6,734,552 B2 * 5/2004 Combs et al. .................. 257/707
2009/0243065 A1 * 10/2009 Sugino et al. .................. 257/686
(Continued)

FOREIGN PATENT DOCUMENTS

JP 7-226421 8/1995
JP H11-330315 11/1999
(Continued)

OTHER PUBLICATIONS

Extended European Search Report dated Dec. 17, 2015 from corresponding European Patent Application No. 13195782.1, 10 pages.
(Continued)

*Primary Examiner* — Hoa B Trinh (57) ABSTRACT

A semiconductor device having a substrate including a plurality of external terminals on a rear surface and a plurality of bonding terminals electrically connected to the plurality of external terminals on a front surface, a semiconductor chip mounted on the front surface of the substrate, a surface of the chip including a plurality of bonding pads, a plurality of bonding wires connecting between the plurality of bonding pads or between the plurality of bonding terminals and the plurality of bonding wires respectively, a first sealing layer sealing the front surface of the substrate, the plurality of bonding wires and the semiconductor chip, and a second sealing layer comprised of the same material as the first sealing, the second sealing layer being formed above the first sealing layer.

10 Claims, 7 Drawing Sheets

(51) Int. Cl.
*H01L 23/31* (2006.01)
*H01L 23/433* (2006.01)
*H01L 21/56* (2006.01)
*H01L 23/00* (2006.01)

(52) U.S. Cl.
CPC ............ *H01L 23/4334* (2013.01); *H01L 24/48* (2013.01); *H01L 24/49* (2013.01); *H01L 24/29* (2013.01); *H01L 24/32* (2013.01); *H01L 24/45* (2013.01); *H01L 24/73* (2013.01); *H01L 2224/05554* (2013.01); *H01L 2224/2919* (2013.01); *H01L 2224/32225* (2013.01); *H01L 2224/45144* (2013.01); *H01L 2224/45147* (2013.01); *H01L 2224/4813* (2013.01); *H01L 2224/48227* (2013.01); *H01L 2224/49175* (2013.01); *H01L 2224/73215* (2013.01); *H01L 2224/73265* (2013.01); *H01L 2924/15311* (2013.01); *H01L 2924/181* (2013.01)

(56) References Cited

U.S. PATENT DOCUMENTS

| | | |
|---|---|---|
| 2011/0049701 A1 | 3/2011 | Miyagawa |
| 2012/0104591 A1 | 5/2012 | Warren et al. |

FOREIGN PATENT DOCUMENTS

| | | |
|---|---|---|
| JP | 2002-33443 | 1/2002 |
| JP | 2005-328086 | 11/2005 |
| JP | 2006-253179 | 9/2006 |
| JP | 2007-95932 | 4/2007 |
| JP | 2010-87442 | 4/2010 |
| JP | 2010-109246 | 5/2010 |
| JP | 2012-94592 | 5/2012 |

OTHER PUBLICATIONS

Japanese Office Action mailed May 24, 2016 in corresponding Japanese Patent Application No. 2012-267892.

\* cited by examiner

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2012-267892, filed on Dec. 7, 2012; the entire contents of which are incorporated herein by reference.

FIELD OF THE INVENTION

The present invention is related to a semiconductor device and a method of manufacturing the same. In particular, the present invention is related to a semiconductor package in which a large heat generating semiconductor chip is sealed which simultaneously achieves low thermal resistance and high density and a method of manufacturing the same.

BACKGROUND OF THE INVENTION

A package is conventionally known which is installed with a heat sink as a package for use in relatively large heat generating semiconductor chip such as a graphics processor. Although a semiconductor device is known as is described in Japanese Laid Open Patent 2012-94592 for example as a package in which the upper surface of a heat sink is completely exposed, since warping is produced when the thermal expansion rate of the exposed heat sink and a sealing material is different, there is a problem with the adhesion strength between the heat sink and the sealing material and thus it is desirable that the heat sink be sealed within the package.

PRIOR ART DOCUMENTS

Patent Document 1: Japanese Laid Open Patent 2012-94592

SUMMARY OF THE INVENTION

Figure 5:
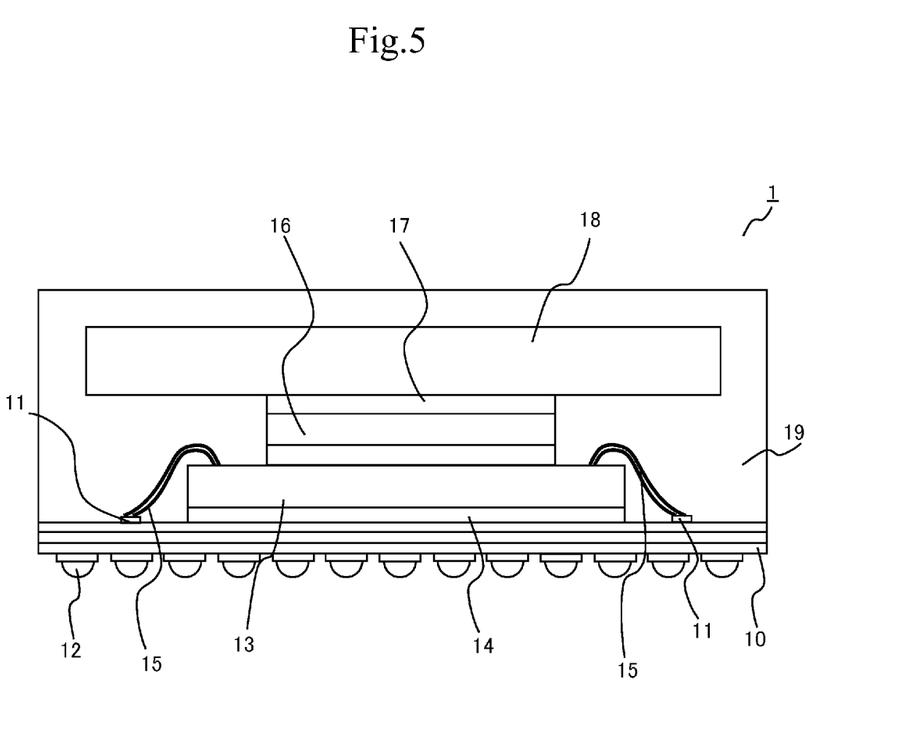
FIG. 5 is a cross-sectional diagram of a conventional semiconductor device.

An example of a cross section of a conventional BGA package in which a heat sink is sealed within a package is shown in FIG. 5. That is, a conventional BGA package in which a heat sink is sealed within a package is comprised of a substrate 10, a semiconductor chip 13 mounted to the substrate 10 by an adhesive 14, a bonding wire 15, a spacer 16 arranged above the semiconductor chip 13, a heat sink 18 mounted above the spacer 16 by an adhesive 17, and a sealing layer 19 configured to seal these components comprised from a sealing material.

A plurality of external terminals 12 is formed on the rear surface of the substrate 10 and a plurality of bonding terminals 11 is formed on the front surface to electrically connect with the external terminals 12. The semiconductor chip 13 is formed with a plurality of bonding pads 21 (FIG. 6) on the front surface and the bonding pads 12 and bonding terminals 11 are connected via the bonding wire 15.

Since a sealing material is injected last in this configuration, voids may be formed between the heat sink 18 and semiconductor chip 13 leading to deterioration in thermal resistance.

Furthermore, because it is necessary to form the spacer 16 on the front surface of the semiconductor chip 13 in this configuration, there is a limit to arranging a bonding wire. That is, as is shown in FIG. 6, it was difficult to arrange the bonding wire 20 which connects between a bonding pad 22 and a bonding pad 23 on the front surface of the semiconductor chip 13.

Figure 6:
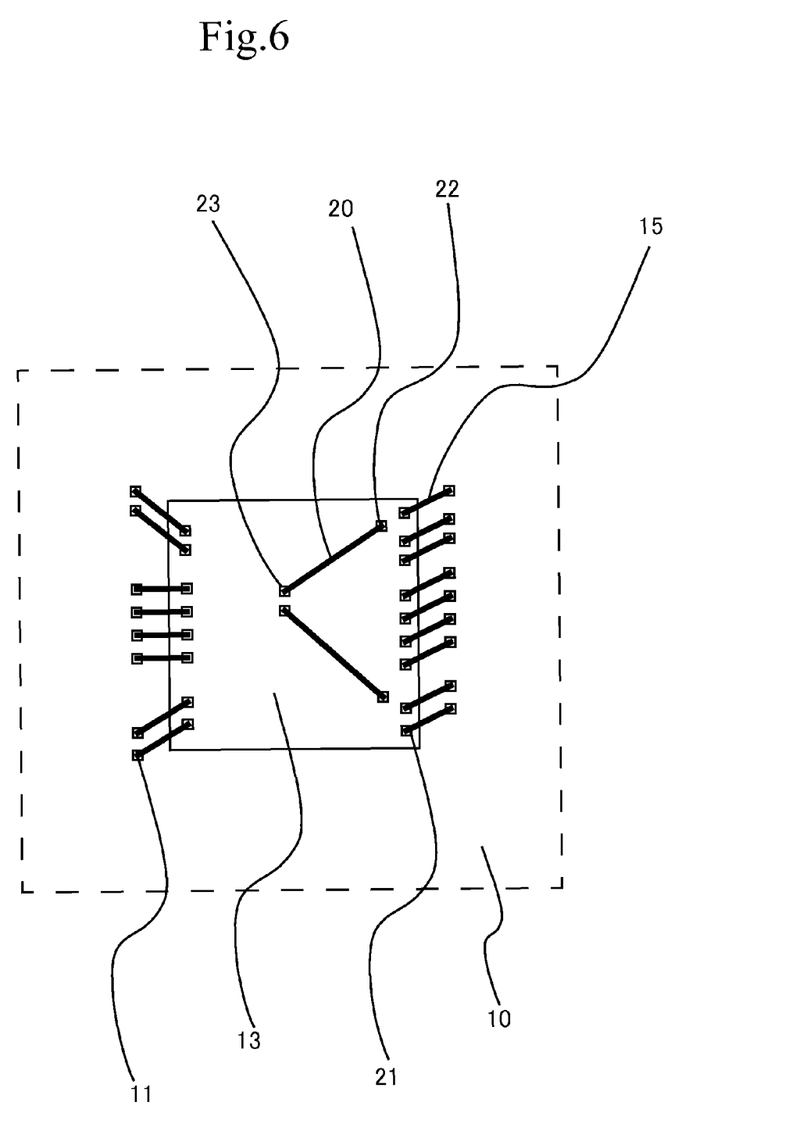
FIG. 6 is a planar view diagram of a conventional semiconductor device.
Figure 7:
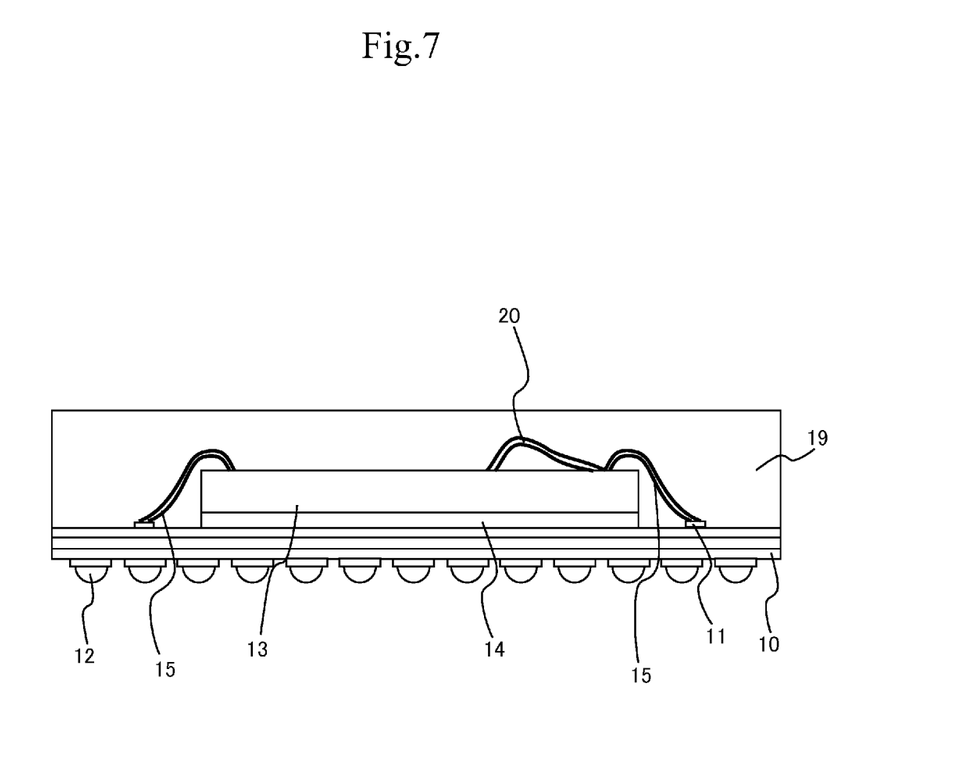
FIG. 7 is a cross-sectional diagram of a conventional semiconductor device.

In the case where the bonding wire 20 which connects between bonding pads on the front surface of the semiconductor chip as shown in FIG. 6, it was difficult to seal a heat sink together with a semiconductor chip. Therefore, although the configuration such as the cross sectional view shown in FIG. 7 is inevitable, here, using a thermal transmittance sealing component as a sealing component was examined. However, the thermal transmittance sealing component has high viscosity and a large wire sweep due to high viscosity of sealing component which leads to the problem of electrical short between bonding wires.

The present invention was arrived at in view of the problems described above and aims to provide a semiconductor device with excellent thermal resistance in which low thermal resistance and high density are simultaneously achieved and a method of manufacturing the same. Furthermore, the present invention aims to provide a semiconductor device in which the level of freedom in arranging a bonding wire is high or in which wire sweep does not occur and a method of manufacturing the same.

In order to solve the problems described above, a semiconductor device of one embodiment of the present invention comprises a substrate having a plurality of external terminals on a rear surface and a plurality of bonding terminals electrically connected to the plurality of external terminals on a front surface, a semiconductor chip having a plurality of bonding pads on a surface of the semiconductor chip mounted on the front surface of the substrate, a plurality of bonding wires connecting between the plurality of bonding pads or between a plurality of bonding terminals and a plurality of bonding pads respectively, a first sealing layer sealing the front surface of the substrate, the plurality of bonding wires and the semiconductor chip, and a second sealing layer formed above the first sealing layer and having a higher thermal conductivity than a thermal conductivity of the first sealing layer.

It is preferred that a semiconductor package of one embodiment of the present invention comprises a heat sink which is mounted above the first sealing layer by an adhesive and enclosed by the second sealing layer, and the thermal conductivity of the adhesive is preferred to be higher than the thermal conductivity of the first sealing layer.

A semiconductor device of one embodiment of the present invention having a substrate including a plurality of external terminals on a rear surface and a plurality of bonding terminals electrically connected to the plurality of external terminals on a front surface, a semiconductor chip mounted on the front surface of the substrate, a surface of the semiconductor chip having the plurality of bonding pads, a plurality of bonding wires connecting between the plurality of bonding pads or between the plurality of bonding terminals and the plurality of bonding pads, a first sealing layer sealing the front surface of the substrate, the plurality of bonding wires and the semiconductor chip, a heat sink mounted above the first sealing layer by an adhesive, and a second sealing layer formed separately to the first sealing layer above the first sealing layer, the second sealing layer sealing the heat sink.

Furthermore, a method of manufacturing a semiconductor device of one embodiment of the present invention comprises mounting a semiconductor chip having a plurality of bonding pads on a substrate including a plurality of external terminals on a rear surface of the substrate and a plurality of bonding terminals electrically connected to the plurality of external terminals on a front surface of the substrate, connecting the plurality of bonding pads together or connecting between the plurality of bonding terminals and the plurality of bonding pads with the plurality of bonding wires, forming a first sealing layer sealing the front surface of the substrate, the plurality of bonding wires and the semiconductor chip, and forming a second sealing layer above the first sealing layer, forming a second sealing layer having a higher thermal conductivity than a thermal conductivity the first sealing layer on the first sealing layer.

It is preferred that after forming the first sealing layer, a dissipation plate is mounted above the first sealing layer by an adhesive and a second sealing layer is formed above the heat sink. In addition, it is preferred that viscosity of a sealing material which comprises the first sealing layer is lower than viscosity of a sealing material which comprises the second sealing layer Furthermore, a method of manufacturing a semiconductor device of one embodiment of the present invention comprises mounting a semiconductor chip having a plurality of bonding pads on a substrate including a plurality of external terminals on a rear surface and a plurality of bonding terminals electrically connected to the plurality of external terminals on a front surface, connecting the plurality of bonding pads together or connecting between the plurality of bonding terminals and the plurality of bonding pads with the plurality of bonding wires, forming a first sealing layer sealing the front surface of the substrate, the plurality of bonding wires and the semiconductor chip, and mounting a heat sink above the first sealing layer by an adhesive, and forming a second sealing layer above the first sealing layer and the heat sink.

According to the present invention it is possible to provide a semiconductor device with excellent heat resistance in which low thermal resistance and high density are simultaneously achieved and a method of manufacturing the same. Furthermore, it is possible to provide a semiconductor device in which the level of freedom in arranging a bonding wire is high or in which wire sweep does not occur and a method of manufacturing the same.

EMBODIMENTS

The embodiments of the present invention are explained below while referring to the drawings. Furthermore, the same reference symbols are attached to the same structural components and therefore repeating explanations between embodiments are omitted.

Figure 1:
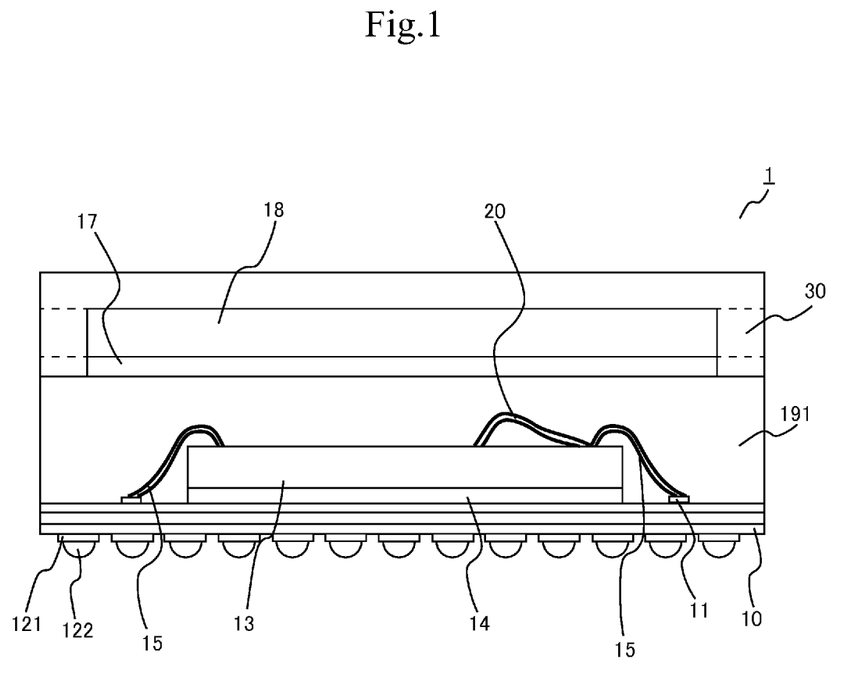
FIG. 1 is a cross-sectional diagram of a semiconductor device of one embodiment of the present invention.
Figure 2:
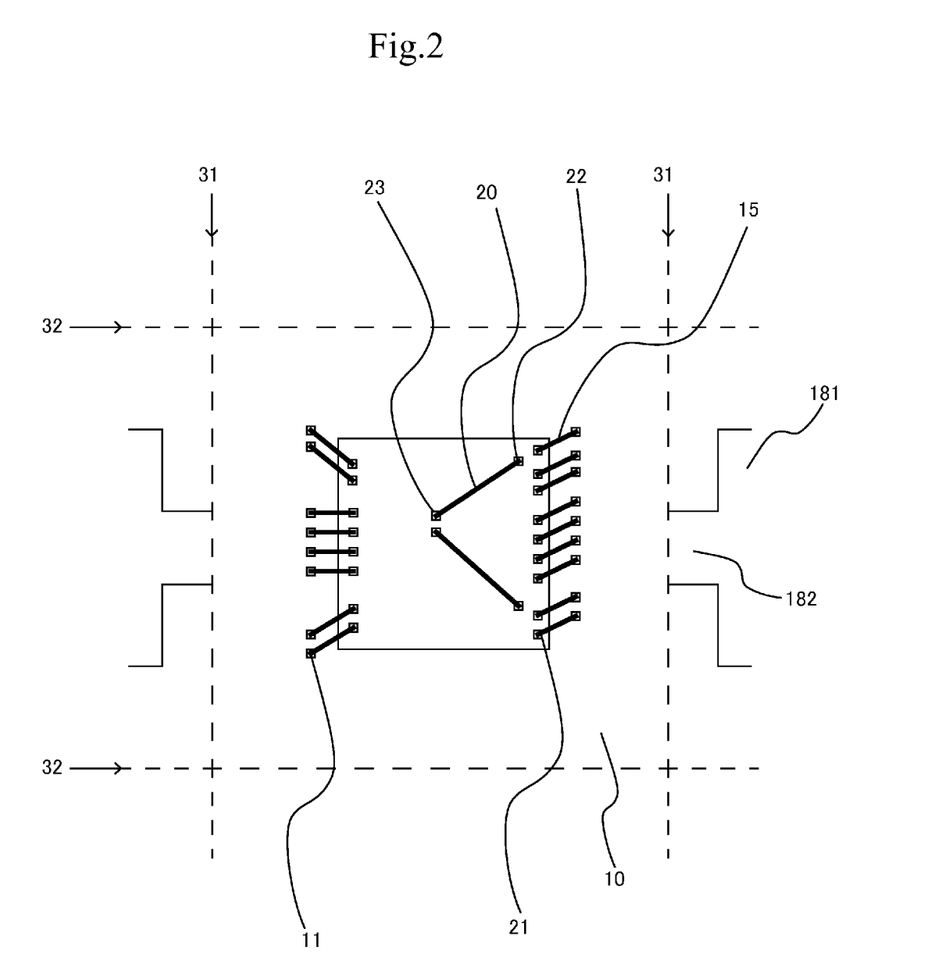
FIG. 2 is a planar view diagram of a semiconductor device of one embodiment of the present invention.

FIG. 1 is a cross-sectional diagram of a semiconductor device 1 which is a BGA package of one embodiment of the present invention. FIG. 2 is a planar view diagram of the semiconductor 1 which is a BGA package of one embodiment of the present invention (however, prior to formation of a sealing layer 30). The BGA package is comprised from a substrate 10 (interposer), a semiconductor chip 13 mounted to the substrate 10 by an adhesive 14, a bonding wire 15 and bonding wire 20 connecting between the bonding pads, and a sealing layer 191 which seals these components using a sealing material. Furthermore, the package also includes a heat sink 18 mounted to the surface of the sealing layer 191 by an adhesive 17 and a sealing layer 30 including a heat transmittance sealing material and sealing these components.

The substrate 10 is comprised of a glass fiber reinforced epoxy substrate (PCB) or a polyimide film, a plurality of external terminal patterns 121 is formed on the rear surface of the substrate and a BGA pattern is formed by adding a solder ball 122. A plurality of bonding terminals 11 electrically connected with the external terminals 12 is formed on the front surface of the substrate 10. The semiconductor chip 13 is formed with a plurality of bonding pads 21 on the front surface and the bonding pads and bonding terminals 11 are connected via the bonding wire 15. Furthermore, a plurality of bonding pads 22, 23 are further formed on the front surface of the semiconductor chip 13 and the plurality of bonding pads 22, 23 are connected via a bonding wire 20.

Although a silver paste or die-attachment film are preferred as an adhesive material for mounting the semiconductor chip 13 on the substrate 10, any material is sufficient as long as the material can maintain adhesive properties between the semiconductor chip and substrate. Although a material which has excellent conductivity such as a gold wire or copper wire for example are preferred as the material for the bonding wire, any material is sufficient as long as the material contains the required conductivity and connectivity.

A general sealing material applied as the sealing layer 191 is comprised of an epoxy resin dispersed with silica fillers having thermal conductivity of around 1 wt/mK. When a high thermal conductivity sealing material applied as the sealing layer 30 is comprised from an epoxy resin dispersed with fillers, the fillers comprising of aluminum or alumina and having thermal conductivity of around 3~4 wt/mK. Since the sealing material for the sealing layer 30 has poor insulation properties (low resistance) despite having high thermal conductivity compared to a general sealing material, the sealing layer 30 is formed so as not to be contacted with a bonding wire.

Although the heat sink 18 is comprised of a copper plate with a preferable thickness of around 0.5 mm, any plate may be applied as long as the plate demonstrates heat dissipation effects. Although a silver paste with a thickness of around 0.2 mm is preferred as the adhesive 17 which fixes the heat sink 18 on the sealing layer 191, any material may be applied as long as the material maintains adhesive of the heat sink 18 adhesive to the sealing layer 191 and has an intermediate thermal conductivity between that of the sealing layer 191 and the heat sink 18. It is preferred that the size of the heat sink be at least sufficient to cover the semiconductor chip. The thickness of the sealing layer 30 is around 1.1 mm and the covering depth of the heat sink is around 0.4 mm. Since it is possible that cracks are occurred when the covering depth of the heat sink is thin, it is necessary to form the covering depth of the heat sink with a sufficient thickness so that cracks are not occurred.

When the structure described above is adopted, it is possible to provide a semiconductor device with excellent heat resisting property in which low thermal resistance and high density are simultaneously achieved.

A manufacturing method of a semiconductor device of one embodiment of the present invention is explained while referring to FIG. 1 and FIG. 2. First, the semiconductor chip 13 is mounted on the substrate 10 (a substrate including external terminals 121 on the rear surface of the substrate and bonding terminals 11 on the front surface f the substrate) using the adhesive 14 comprised of a silver paste before the substrate 10 is cut and divided/singulated. Then, between the bonding pads 22, 23 of the semiconductor chip or between the bonding terminals 11 and bonding pads 21 are connected using the bonding wires 20 or 15 respectively. Next, the surface of the substrate 10, bonding wires 20 and 15 and the semiconductor chip 13 are sealed by the general sealing material described above by transfer mold method or coating method then the sealing layer 191 is formed. At this time, the general sealing material has a lower viscosity than a high thermal conductivity sealing material, therefore he sealing layer 191 comprised of the general sealing material does not occurred the problem of wire sweep. In addition, since no part which becomes behind of a heat sink compared to structure in FIG. 5, it is difficult for voids to occur in the sealing layer 191.

Next, the heat sink 18 is mounted to the surface of the sealing layer 191 using the silver paste 17. The heat sink 18 completely covers the semiconductor chip as shown in FIG. 2 and also covers the bonding terminals. In addition, in order to batch manufacture a plurality of semiconductor chips, heat sinks 18 of adjacent semiconductor device are linked via a tie-bar 182. Next, the sealing layer 191 and the surface of the heat sink 18 are sealed by the high thermal conductivity sealing material described above by a transfer mold method or coating method then the sealing layer 30 is formed. Although the high thermal conductivity sealing material has a higher thermal conductivity than a thermal conductivity of a general sealing material and lower insulation properties than insulation properties of the general sealing material, a wire flow occurs easily due to high viscosity. However, according to the present invention sealed layers have a double layer structure, therefore a wire is not present within the sealing layer 30, the problem of wire sweep does not occur. Since no part which becomes behind of a heat sink compared to structure in FIG. 5, it is difficult for voids to occur in the sealing layer 191. Finally, the product is cut and divided/singulated along the line 31 in FIG. 2.

Figure 3:
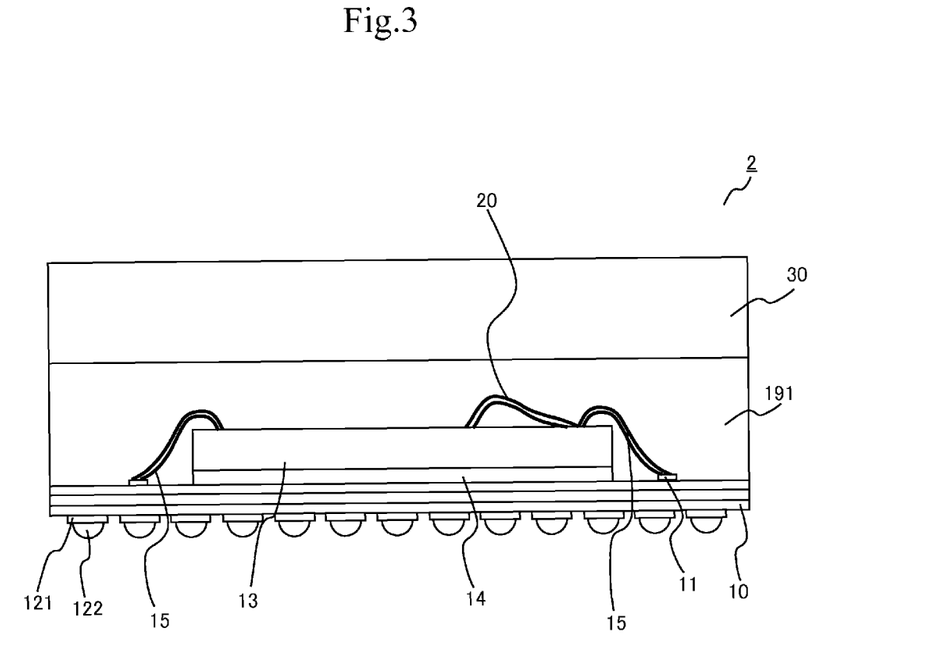
FIG. 3 is a cross-sectional diagram of a semiconductor device of one embodiment of the present invention.

FIG. 3 is a cross-sectional diagram of a semiconductor device 2 which is BGA package of another embodiment of the present invention. The difference between the semiconductor device 2 and the semiconductor device 1 shown in FIG. 1 is that the heat sink has been removed. In the case where sufficient heat dissipation effects can be achieved just with the sealing layer 30 comprised of a high thermal conductivity sealing material, the heat sink may be removed.

The manufacturing method of the semiconductor device 2 is almost the same as the manufacturing method of semiconductor device 1, however the process for mounting the heat sink is omitted.

Figure 4:
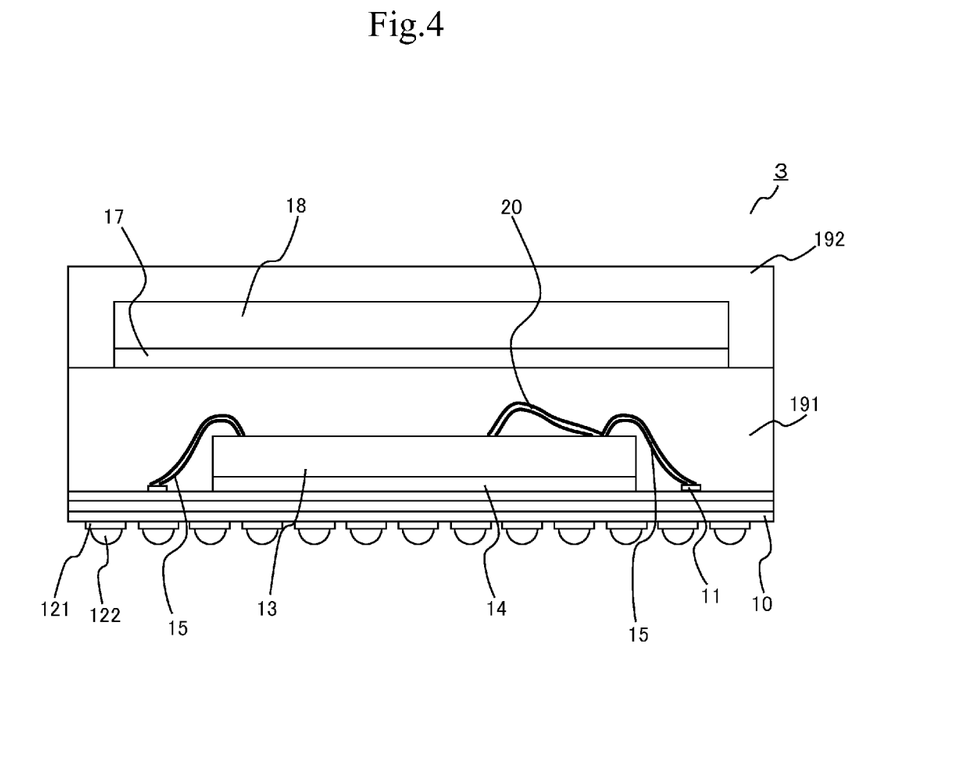
FIG. 4 is a cross-sectional diagram of a semiconductor device of one embodiment of the present invention.

FIG. 4 is a cross-sectional diagram of a semiconductor device 3 which is a BGA package of another embodiment of the present invention. The difference between the semiconductor device 3 and the semiconductor device 1 shown in FIG. 1 is that a high thermal conductivity sealing material is not applied for a sealing layer 192 and the same sealing material as the sealing layer 191 is applied for the sealing layer 192. In the case where sufficient heat dissipation effects can be achieved just with heat sink 18, then it is not necessary for the sealing layer 192 to be adapted a high thermal conductivity sealing material.

Although the manufacturing method of the semiconductor device 3 is almost the same as the manufacturing method of semiconductor device 1, the semiconductor device 3 is manufactured by replacing the high thermal conductivity sealing material with a general sealing material.

According to the structure described above, it is possible to provide a semiconductor device with excellent heat resistance in which low thermal resistance and high density are simultaneously achieved and a method of manufacturing the same. Furthermore, it is possible to provide a semiconductor device in which the level of freedom in arranging a bonding wire is high or in which wire sweep does not occur and a method of manufacturing the same.

What is claimed is:

1. A semiconductor device comprising:
   a substrate including a plurality of external terminals on a rear surface and a plurality of bonding terminals electrically connected to the plurality of external terminals on a front surface;
   a semiconductor chip having a plurality of bonding pads on a surface of the semiconductor chip and mounted on the front surface;
   a plurality of bonding wires connecting between the plurality of bonding pads or between the plurality of bonding terminals and the plurality of bonding wires respectively;
   a first encapsulation layer sealing the front surface of the substrate, the plurality of bonding wires and the semiconductor chip; and
   a second encapsulation layer formed above the first encapsulation layer and attached to the first encapsulation layer, wherein
   the second encapsulation layer has a higher thermal conductivity than a thermal conductivity of the first encapsulation layer, and
   a filler of the first encapsulation layer is silica, and a filler of the second encapsulated layer is aluminum or alumina.

2. The semiconductor device according to claim 1, wherein a heat sink is mounted above the first encapsulation layer by an adhesive and encapsulated by the second encapsulation layer.

3. The semiconductor device according to claim 2, wherein the thermal conductivity of the adhesive is higher than the thermal conductivity of the first encapsulation layer.

4. A semiconductor device comprising:
   a substrate including a plurality of external terminals on a rear surface and a plurality of bonding terminals electrically connected to the plurality of external terminals on a front surface;
   a semiconductor chip having a plurality of bonding pads on a surface of the semiconductor chip and mounted on the front surface;
   a plurality of bonding wires connecting between the plurality of bonding pads or between the plurality of bonding terminals and the plurality of bonding wires respectively;
   a first encapsulation layer sealing the front surface of the substrate, the plurality of bonding wires and the semiconductor chip;
   a heat sink mounted above the first encapsulation layer by an adhesive; and
   a second encapsulation layer sealing the first encapsulation layer,
   wherein the heat sink is formed above the first encapsulation layer.

5. A method of manufacturing a semiconductor device comprising:
   mounting a semiconductor chip having a plurality of bonding pads on a substrate including a plurality of external terminals on a rear surface and a plurality of bonding terminals electrically connected to the plurality of external terminals on a front surface;

connecting between the plurality of bonding pads or between the plurality of bonding terminals and the plurality of bonding wires respectively;

forming a first encapsulation layer sealing the front surface of the substrate, the plurality of bonding wires and the semiconductor chip; and forming a second encapsulation layer, which has a higher viscosity than a viscosity of the first encapsulated layer, above the first encapsulation layer and attached to the first encapsulation layer, wherein the second encapsulation layer has a higher thermal conductivity than a thermal conductivity of the first encapsulation layer.

6. The method of manufacturing a semiconductor device according to claim 5, wherein after forming the first encapsulation layer, mounting a heat sink above the first encapsulation layer by an adhesive and forming a second encapsulation layer above the heat sink.

7. The method of manufacturing a semiconductor device according to claim 5, wherein viscosity of a sealing material which comprises the first encapsulation layer is lower than viscosity of a sealing material which comprises the second encapsulation layer.

8. A method of manufacturing a semiconductor device comprising:

mounting a semiconductor chip having a plurality of bonding pads on a substrate including a plurality of external terminals on a rear surface and a plurality of bonding terminals electrically connected to the plurality of external terminals on a front surface;

connecting between the plurality of bonding pads or between the plurality of bonding terminals and the plurality of bonding wires respectively;

forming a first encapsulation layer sealing the front surface of the substrate, the plurality of bonding wires and the semiconductor chip;

mounting a heat sink above the first encapsulation layer by an adhesive; and forming a second encapsulation layer above the first encapsulation layer and the heat sink.

9. A semiconductor device comprising:

a substrate including a plurality of external terminals on a rear surface and a plurality of bonding terminals electrically connected to the plurality of external terminals on a front surface;

a semiconductor chip having a plurality of bonding pads on a surface of the semiconductor chip and mounted on the front surface;

a plurality of bonding wires connecting between the plurality of bonding pads or between the plurality of bonding terminals and the plurality of bonding wires respectively;

a first encapsulation layer sealing the front surface of the substrate, the plurality of bonding wires and the semiconductor chip;

a heat sink mounted above the first encapsulation layer; and a second encapsulation layer sealing the first encapsulation layer, wherein the heat sink is encapsulated by the second encapsulation layer, and the second encapsulation layer and the first encapsulation layer are comprised of the same sealing material.

10. A method of manufacturing a semiconductor device comprising:

mounting a semiconductor chip having a plurality of bonding pads on a substrate including a plurality of external terminals on a rear surface and a plurality of bonding terminals electrically connected to the plurality of external terminals on a front surface;

connecting between the plurality of bonding pads or between the plurality of bonding terminals and the plurality of bonding wires respectively;

forming a first encapsulation layer sealing the front surface of the substrate, the plurality of bonding wires and the semiconductor chip; and forming a second encapsulation layer above the first encapsulation layer and attached to the first encapsulation layer, in a process separate from the forming the first encapsulation layer, wherein the second encapsulation layer and the first encapsulation layer are comprised of the same sealing material.

* * * * *